(12) United States Patent
Zeng et al.

(10) Patent No.: US 8,462,577 B2
(45) Date of Patent: Jun. 11, 2013

(54) SINGLE TRANSISTOR DRIVER FOR ADDRESS LINES IN A PHASE CHANGE MEMORY AND SWITCH (PCMS) ARRAY

(75) Inventors: Raymond W. Zeng, Sunnyvale, CA (US); DerChang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 13/051,800

(22) Filed: Mar. 18, 2011

(65) Prior Publication Data

US 2012/0236676 A1    Sep. 20, 2012

(51) Int. Cl.
G11C 8/00    (2006.01)
(52) U.S. Cl.
USPC .......... 365/230.06; 365/163; 365/185.05; 365/185.11; 365/185.13; 365/185.17; 365/185.18; 365/185.23
(58) Field of Classification Search
USPC .......... 365/230.06, 163, 185.05, 185.11, 365/185.13, 185.17, 185.18, 185.23
See application file for complete search history.

(56) References Cited

U.S. PATENT DOCUMENTS

| 7,502,277 | B2 | 3/2009 | Wu et al. |
| 7,940,590 | B2 * | 5/2011 | Martinelli et al. ............ 365/204 |
| 2005/0041461 | A1 | 2/2005 | Hirabayashi |
| 2005/0180188 | A1 | 8/2005 | Bedeschi et al. |
| 2009/0161437 | A1 * | 6/2009 | Pyeon et al. ............. 365/185.17 |
| 2010/0177560 | A1 | 7/2010 | Mcelheny et al. |
| 2010/0208520 | A1 * | 8/2010 | Wang et al. ............. 365/185.05 |
| 2010/0321977 | A1 * | 12/2010 | Sekar et al. ................... 365/148 |
| 2011/0222348 | A1 * | 9/2011 | Kim et al. ............... 365/185.18 |
| 2012/0033491 | A1 * | 2/2012 | Shelton et al. ............. 365/185.2 |
| 2012/0188838 | A1 * | 7/2012 | Cheng et al. ............. 365/230.06 |

FOREIGN PATENT DOCUMENTS

WO    2012/128884 A2    9/2012
WO    2012/128884 A3    11/2012

OTHER PUBLICATIONS

International Search Report and written Opinion Received for PCT Patent Application No. PCT/US2012/026121, Mailed on Sep. 26, 2012, 10 pages.

* cited by examiner

*Primary Examiner* — Fernando Hidalgo
(74) *Attorney, Agent, or Firm* — Winkle, PLLC

(57) ABSTRACT

The present disclosure relates to the fabrication of non-volatile memory devices. In at least one embodiment, a single transistor may be used to drive each address line, either a wordline or a bitline. Both an inhibit voltage and a selection voltage may be driven through these single transistor devices, which may be achieved with the introduction of odd and even designations for the address lines. In one operating embodiment, a selected address line may be driven to a selection voltage, and the address lines of the odd or even designation which is the same as the selected address line are allowed to float. The address lines of the odd or even designation with is different from the selected address lines are driven to an inhibit voltage, wherein adjacent floating address lines may act as shielding lines to the selected address line.

4 Claims, 9 Drawing Sheets

SINGLE TRANSISTOR DRIVER FOR ADDRESS LINES IN A PHASE CHANGE MEMORY AND SWITCH (PCMS) ARRAY

BACKGROUND OF THE INVENTION

The present disclosure relates generally to the fabrication of microelectronic memory. The microelectronic memory may be non-volatile, wherein the memory can retain stored information even when not powered.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
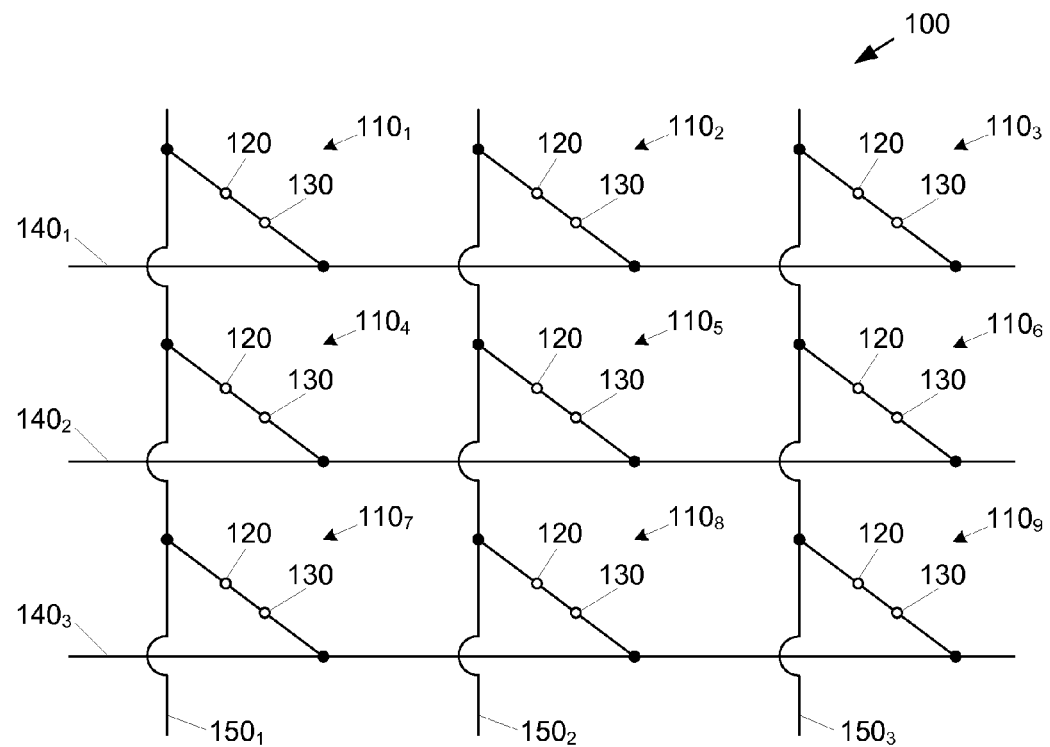
FIG. 1 is a schematic depiction illustrating a phase change memory array.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Figure 2:
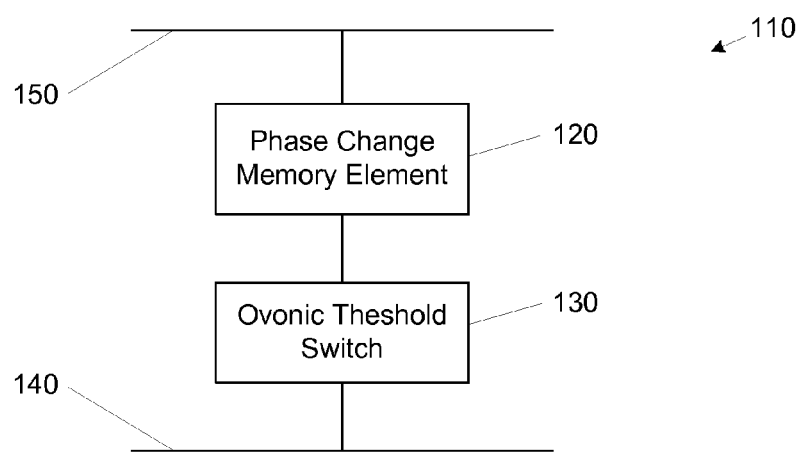
FIG. 2 is a schematic depiction illustrating a phase change memory stack.

FIG. 1 shows a memory array 100 comprising, for illustration purposes, a 3×3 array of memory cells $110_1$-$110_9$, and FIG. 2 shows a single memory cell 110 (analogous to any of memory cells $110_1$-$110_9$ of FIG. 1). Each memory cell (110 and $110_1$-$110_9$) may include a phase change memory element 120 and an ovonic threshold switch 130.

The memory array 100 may include column lines $150_1$, $150_2$, and $150_3$ (shown as element 150 in FIG. 2) and row lines $140_1$, $140_2$, and $140_3$ (shown as element 140 in FIG. 2) to select a particular memory cell of the array during a write or read operation. The column lines 150, $150_1$, $150_2$, and $150_3$ and the row lines 140, $140_1$, $140_2$, and $140_3$ may also be referred to as "address lines" since these lines may be used to address memory cells 110, $110_1$-$110_9$ during programming or reading. The column lines 150, $150_1$, $150_2$, and $150_3$ may also be referred to as "bitlines", and the row lines 140, $140_1$, $140_2$, and $140_3$ may also be referred to as "wordlines". Further, it is understood that the 3×3 array of FIG. 1 is merely exemplary and may be any appropriate size (i.e. any number of memory cells).

The phase change memory elements 120 may be connected to the column lines 150, $150_1$, $150_2$, and $150_3$ and may be coupled to the row lines 140, $140_1$, $140_2$, and $140_3$ through the ovonic threshold switch 130. Each ovonic threshold switch 130 may be connected in series to each phase change memory element 120 and may be used to access each phase change memory element 120 during programming or reading of each phase change memory element 120. When a particular memory cell (e.g., memory cell 110 of FIG. 2) is selected, voltage potentials may be applied to its associated column line (e.g., element 150 of FIG. 2) and row line (e.g., element 140 of FIG. 2) to apply a voltage potential across the memory cell. It is understood that each ovonic threshold switch 130 could positioned between each phase change memory element 120 and the column lines 150, $150_1$, $150_2$, and $150_3$ with each phase change memory element 120 coupled to the row lines 140, $140_1$, $140_2$, and $140_3$. It is also understood that more than one ovonic threshold switch 130 could be used within each memory cell 110, $110_1$-$110_9$.

The phase change memory elements 120 operate based on the phase changing properties of a phase change material layer, which is interposed between an upper electrode and a lower electrode (with a resistive heating element between lower electrode and the phase change layer) (not shown). As a current is applied, the phase change material layer undergoes a phase change between the amorphous state and the crystalline state due to heat generated by the resistive heating element (by the Joule effect).

The specific resistance of the phase change material element 120 in the amorphous state is higher than the specific resistance of the phase change material element 120 in the crystalline state. Thus, in a read mode, sensing the current flowing through the phase change material element 102 determines whether the information stored has a logic value of "1" or "0".

The phase change memory element 120 may be include a chalcogenide layer as a phase change element therein. The chalcogenide layer may comprise an element of the VI group of the period table (e.g. selenium (Se), tellurium (Te), etc.), usually combined with IV and V groups elements (e.g. germanium (Ge), arsenic (As), antimony (Sb), etc.).

As will be understood to those skilled in the art, the phase change memory cells (e.g. 110, $110_1$-$110_9$) are accessed through wordline and bitline drivers generating the wordline and bitlines signals, respectively. Current phase memory arrays may include wordline drivers and bitline drivers, which each use two or more transistors to drive either an inhibit voltage or a selection voltage to the wordlines or bitlines (depending on which cross point phase change memory element is selected). However, as phase change memory arrays are scaled down for higher efficiency and cost reduction, it is necessary to shrink the drivers to keep the CMOS area under the memory structure small. With existing wordline and bitline driver designs having two or more transistors, it becomes difficult to scale transistor size down enough to keep the memory area and CMOS area at par with one another.

Embodiments of the present description relate to address line drivers and to the operation of non-volatile memory devices. In at least one embodiment, a single transistor may be used to drive each address line, either a wordline or a bitline. Both an inhibit voltage and a selection voltage may be driven through these single transistor devices, at different timings, which may be achieved with the introduction of odd and even designations for the address lines (i.e. wordlines and bitlines). In one operating embodiment, a selected address line may be driven to a selection voltage, and the address lines of the odd or even designation which is the same as the selected address line are allowed to float. The address lines of the odd or even designation with is different from the selected address lines are driven to an inhibit voltage. The adjacent inhibiting address lines may act as shielding lines to the selected address line, which may prevent misfiring due to floating conditions on some of the phase change memory cells, as will be understood to those skilled in the art.

With a reduction in the number of transistors needed for address line drivers down to a single transistor for each, according to the present disclosure, the CMOS area under the memory structure can be made smaller.

Figure 3:
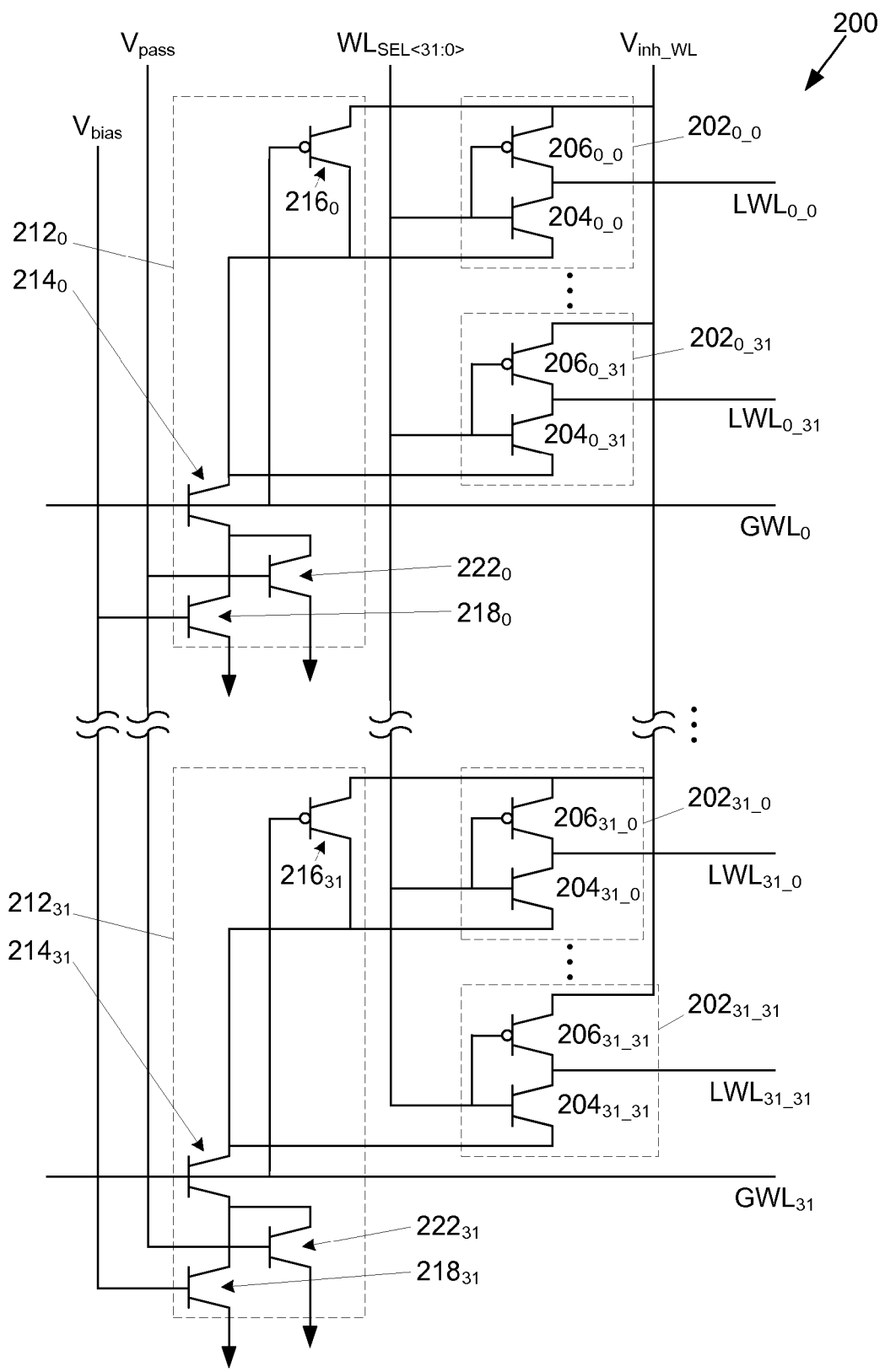
FIG. 3 is a schematic diagram illustrating a wordline driver having a two transistor local wordline driver for a memory array as known in the art.

FIG. 3 illustrates a wordline driver 200 having a two transistor configuration local wordline driver $202_{n\_m}$ (where n is a number for a global wordline within a global wordline set for a memory array, which is illustrated as 32 global wordlines (i.e. 0-31), and m is a number for a local wordline per global wordline set in the memory array, which is illustrated as 32 local wordlines (i.e. 0-31), as known in the art. As illustrated, a local wordline NMOS (N-channel Metal Oxide Semiconductor) field effect transistor $204_{n\_m}$ is utilized to drive a local wordline selection voltage $WL_{SEL<31:0>}$ and a local wordline PMOS (P-channel Metal Oxide Semiconductor) field effect transistor $206_{n\_m}$ may be utilized to drive a local wordline inhibit voltage $V_{inh\_WL}$. As known in the art, a selection voltage is a voltage that is used for programming a memory cell, such as the phase change memory and switch memory cell 110, $110_1$-$110_9$, as illustrated in FIGS. 1 and 2, and an inhibit voltage is a voltage that inhibits programming. The operation of the local wordline NMOS field effect transistors $204_{n\_m}$ and a local wordline PMOS field effect transistors $206_{n\_m}$ in generating local wordlines $LWL_{n\_m}$, as illustrated, is well known in the art and will not be discussed herein. As will be understood to those skilled in the art, any appropriate number of global wordlines and local wordlines may be utilized in a memory array.

As further shown in FIG. 3, the wordline driver 200 may also include global wordline drivers $212_n$, each comprising a global wordline NMOS field effect transistor $214_n$ and a global wordline PMOS field effect transistor $216_n$ (as well as bias NMOS field effect transistor $218_n$ and bypass NMOS field effect transistor $222_n$). As will be understood to those skilled in the art, to select a specific wordline, both the global wordline NMOS field effect transistor $214_n$ and the local wordline NMOS field effect transistor $204_{n\_m}$ device to select the specific wordline $LWL_{n\_m}$ are turned on. The operation of the global wordline drivers $212_n$, along an associated bias voltage $V_{bias}$ for current limiting (current mirroring) and a bypass current mirroring voltage $V_{pass}$, in generating a global wordline $GWL_n$, as illustrated, is well known in the art and will not be discussed herein.

In the wordline driver 200 of FIG. 3, each local wordline $LWL_{n\_m}$ needs both a local wordline NMOS field effect transistor $204_{n\_m}$ and a local wordline PMOS field effect transistor $206_{n\_m}$, which takes considerable space under a memory structure. As illustrated, each local wordline $LWL_{n\_m}$ would require 2.125 transistors (i.e. a local wordline NMOS field effect transistor $204_{n\_m}$, a local wordline PMOS field effect transistor $206_{n\_m}$, and 4/32 of the transistors of the global wordline driver $212_n$.

Figure 4:
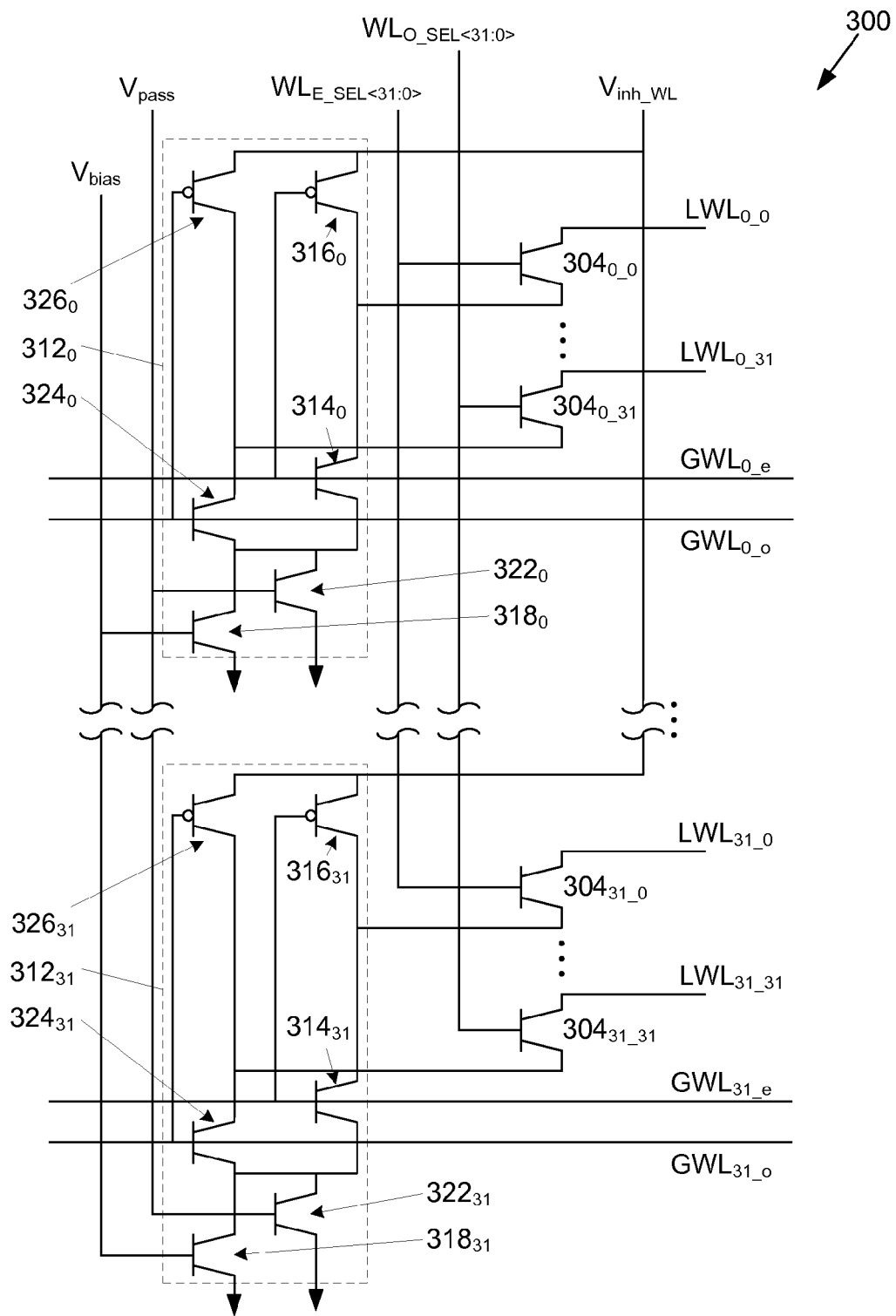
FIG. 4 is a schematic diagram illustrating a wordline driver having a single transistor local wordline driver for a memory array in accordance with one embodiment of the present description.

FIG. 4 illustrates a wordline driver 300 having a single transistor configuration to drive local wordlines $LWL_{n\_m}$, according to one embodiment of the present description. As illustrated, an inhibit voltage $V_{inh\_WL}$ or a selection voltage (either an odd wordline selection signal $WL_{O\_SEL<31:0>}$ or an even wordline selection signal $WL_{E\_SEL<31:0>}$) may pass through a corresponding single field effect transistor $304_{n\_m}$ at different timings. It is understood that although the single field effect transistors $304_{n\_m}$ are illustrated as NMOS transistors, the single filed effect transistors $304_{n\_m}$ may also be PMOS transistors. It is further understood that any appropriate number of global wordlines and local wordlines may be utilized in a given memory array.

The local wordlines $LWL_{n\_m}$ are separated into alternating even and odd designations. For example, local wordlines $LWL_{n\_0}$, $LWL_{n\_2}$ (not specifically shown), . . . , $LWL_{n\_28}$ (not specifically shown), and $LWL_{n\_30}$ (not specifically shown), are "even", i.e. electrically coupled to even wordline selection signal $WL_{E\_SEL<31:0>}$, and local wordlines $LWL_{n\_1}$ (not specifically shown), $LWL_{n\_3}$ (not specifically shown), . . . , $LWL_{n\_29}$ (not specifically shown), and $LWL_{n\_31}$, are "odd", i.e. electrically coupled to odd wordline selection signal $WL_{O\_SEL<31:0>}$.

Figure 7:
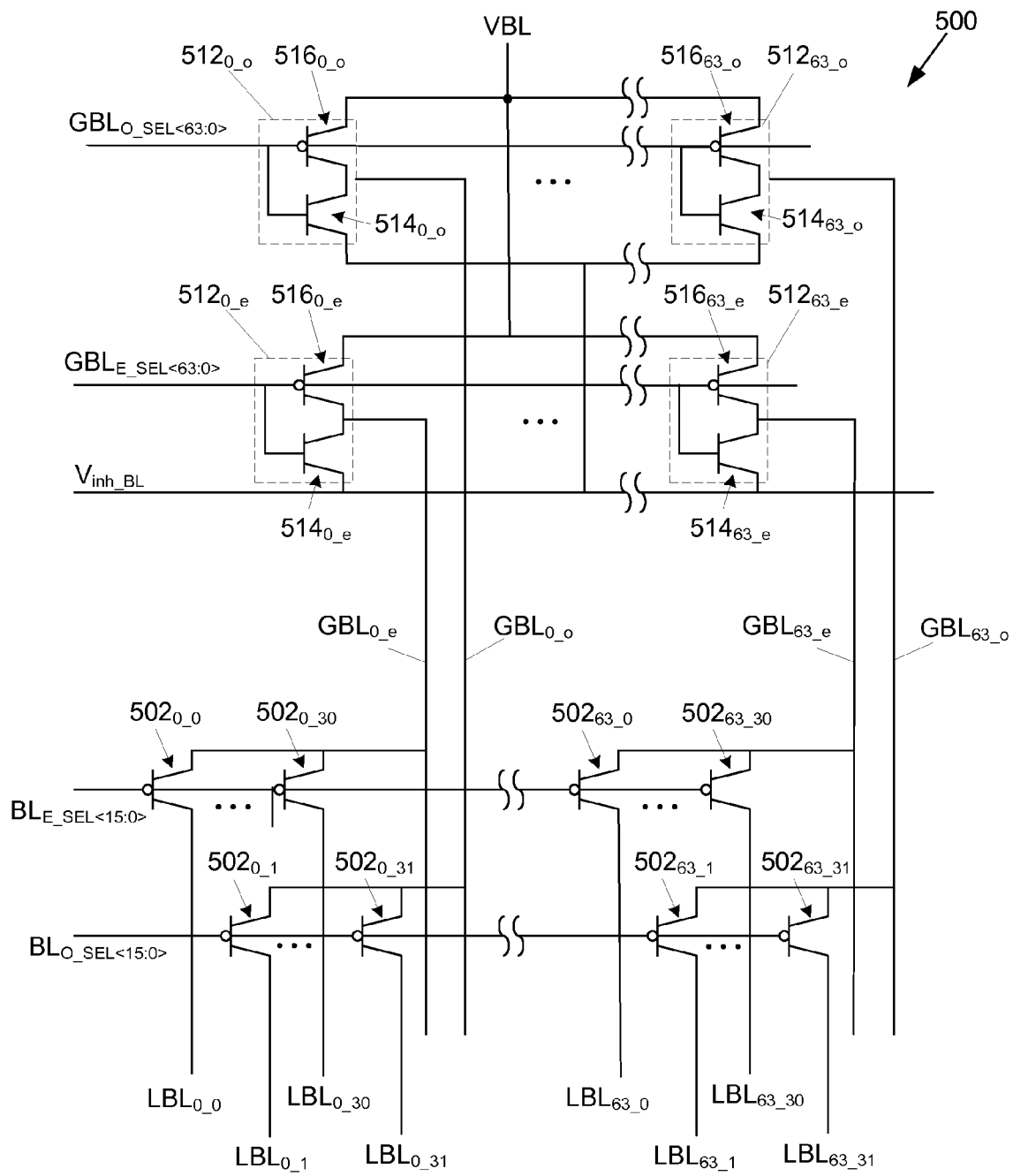
FIG. 7 is a schematic diagram illustrating a bitline driver having a single transistor local bitline driver for a memory array in accordance with one embodiment of the present description.

To correctly pass the inhibit voltage through the appropriate single field effect transistors $304_{n\_m}$, the global wordline is separated into even and odd global wordlines $GWL_{n\_e}$ and $GWL_{n\_o}$, respectively, which are generated by a global wordline driver $312_n$. Further, each global wordline driver $312_n$ may include two transistor pairs (i.e. a first global wordline NMOS field effect transistor $314_n$ paired with a first global wordline PMOS field effect transistor $316_n$, and a second global wordline NMOS field effect transistor $324_n$ paired with a second global wordline PMOS field effect transistor $326_n$) to distinguish between an even selection and an odd selection for each local wordline $LWL_{n\_m}$, as will be understood to those skill in art by referencing FIG. 4. The global wordline drivers $312_n$ may also include a bias NMOS field effect transistor $318_n$ and bypass NMOS field effect transistor $322_n$; the operation of which within the global wordline drivers 312 will be understood to those skilled in the art. It is understood that the specific circuitry and transistor selection illustrated in FIG. 7 is merely exemplary, and that any appropriate circuitry and transistor selection may be used to generate the even global bitlines $GWL_{n\_e}$ and the odd global bitlines $GWL_{n\_o}$.

In the wordline driver 300 of FIG. 4, each local wordline $LWL_{n\_m}$ needs only one local wordline field effect transistor $304_{n\_m}$ as a driver. Thus, each local wordline $LWL_{n\_m}$ would only require 1.1875 transistors (i.e. a local wordline field effect transistor $304_{n\_m}$ and 6/32 of the transistors of the global wordline driver $312_n$.

In the case of an even wordline selection, all of the odd wordlines are inhibited by passing inhibit voltage $V_{inh\_WL}$ through the global wordline driver $312_n$ to trigger the odd global wordline $GWL_{n\_o}$ and turning on all local field effect transistors $304_{n\_m}$ that the are connected to designated odd wordlines (i.e. connected to odd wordline selection signal $WL_{O\_SEL<31:0>}$). For the even wordlines, only the single decoded even wordline gets selected with the rest of the even wordlines kept floating (e.g. neither a selection voltage or an inhibit voltage applied).

Likewise, in the case of an odd wordline selection, all of the even wordlines are inhibited by passing inhibit voltage $V_{inh\_WL}$ through the global wordline driver $312_n$ to trigger the global even wordline $GWL_{n\_e}$ and turning on all local field effect transistors $304_{n\_m}$ that the are connected to designated even wordlines (i.e. connected to even wordline selection signal $WL_{E\_SEL<31:0>}$). For the odd wordlines, only the single decoded odd wordline gets selected with the rest of the odd wordlines kept floating.

Figure 5:
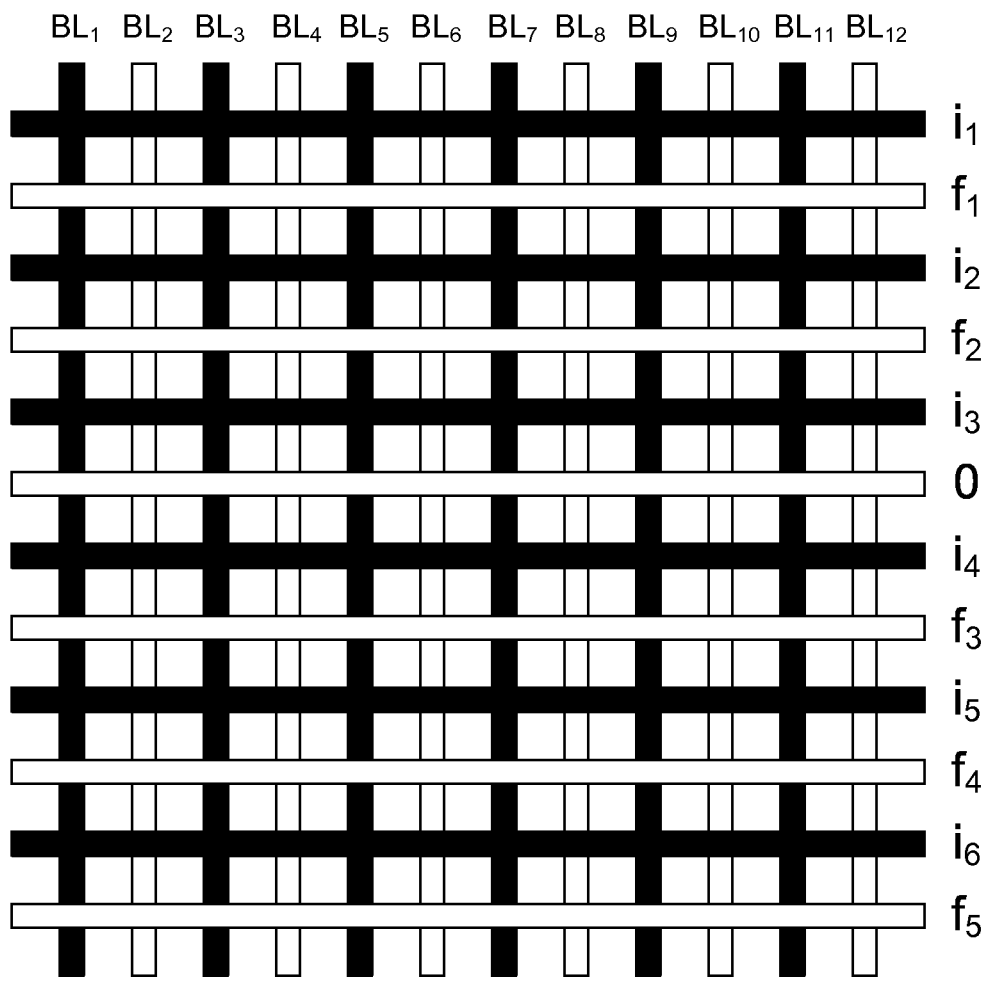
FIG. 5 is a schematic illustrating a condition when an odd wordline is selected, the remainder for the odd wordlines are floating, and the even wordlines are driven to an inhibit voltage for a wordline driving having a single transistor local wordline driver in accordance with one embodiment of the present description.

For example, FIG. 5 illustrates a condition when an odd wordline is selected (labeled as 0) and the remainder of the odd wordlines (unselected) are floating (labeled as $f_1$-$f_5$). In this condition, all of the even wordlines are driven to an inhibited (or "deselected") voltage (labeled as $i_1$-$i_6$). It is noted that the bitlines which run perpendicular to the wordlines in FIG. 5 are simply designated as $BL_1$-$BL_{12}$ and their condition is not designated for clarity, but they will be discussed and illustrated after the discussion regarding single transistor bitline drivers. In this scheme, the floating condition of the unselected wordlines does not affect the memory operation since their adjacent inhibited wordlines to the selected wordline is driven to inhibit voltage during wordline selection.

For bitline drivers according to the present description, a similar concept as described with regard to the wordline driver embodiment illustrated in FIG. 4 can be utilized. Thus, bitline drivers may also be reduced from two or more transistors to a single transistor by introducing even and odd local bitline designations, and even and odd global bitlines.

Figure 6:
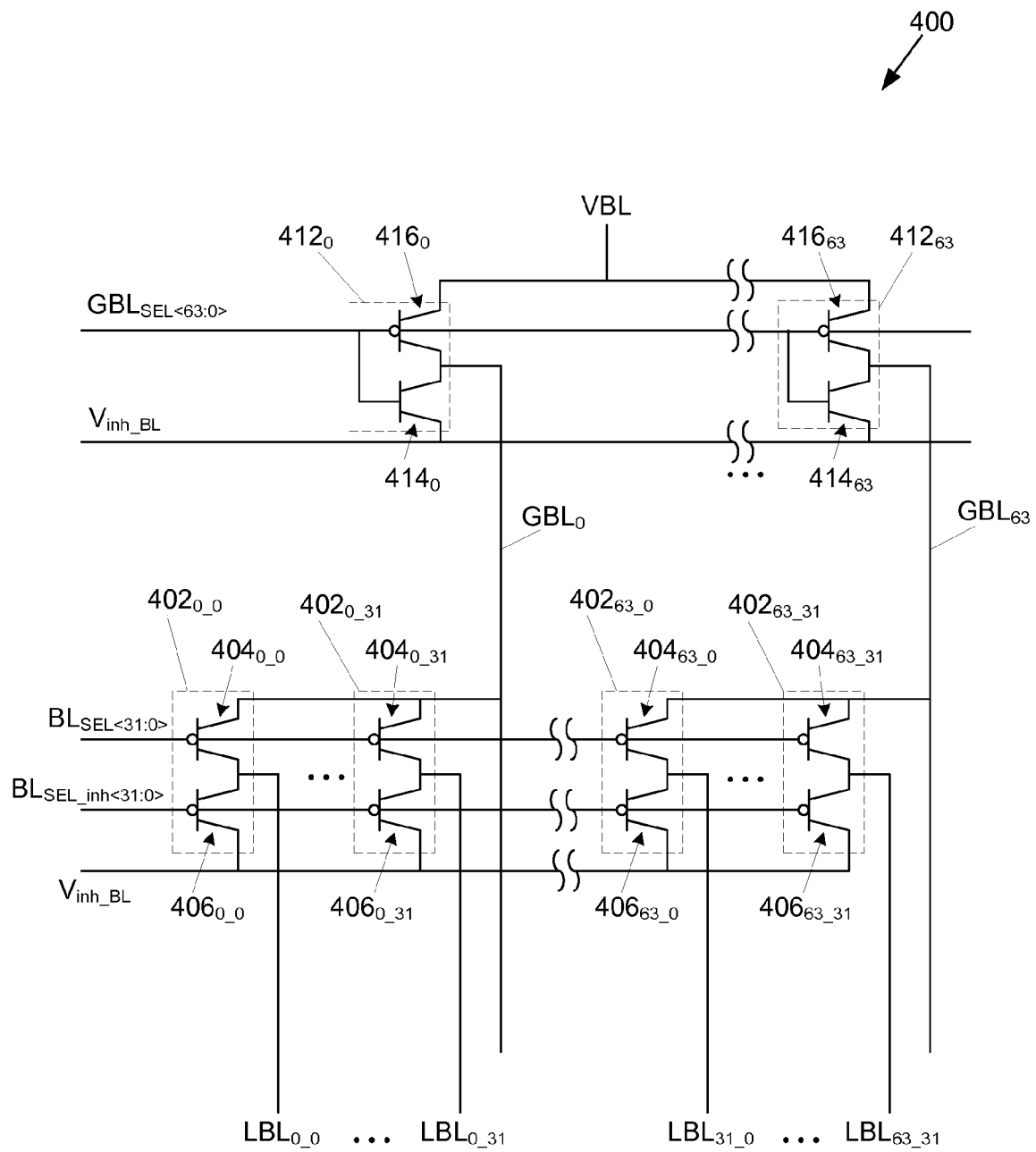
FIG. 6 is a schematic diagram illustrating a bitline driver having a two transistor local bitline driver for a memory array as known in the art.

FIG. 6 illustrates a bitline driver 400 comprising a two transistor configuration to drive local bitlines $LBL_{x\_y}$, as known in the art. As illustrated, the local bitline drivers $402_{x\_y}$ (where x is a number for a global bitline within a global bitline set for a memory array, which is illustrated as 64 global bitlines (i.e. 0-63), and y is a number for a local bitlines per global bitline set in the memory array, which is illustrated as 32 local bitlines (i.e. 0-31), include local bitline PMOS selection field effect transistors $404_{x\_y}$ to drive a bitline selection voltage VBL and a local bitline PMOS inhibit field effect transistor $406_{x\_y}$ to drive a local bitline inhibit voltage $V_{inh\_BL}$. The operation of the local bitline drivers $402_{x\_y}$, along associated local bitline selection signals $BL_{SEL<31:0>}$, the bitline selection voltage VBL, local bitline inhibit signals $BL_{SEL\_inh<31:0>}$, and the local bitline inhibit voltage $V_{inh\_BL}$, in generating the local bitlines $LBL_{x\_y}$, as illustrated, is well known in the art and will not be discussed herein. It is understood that the any appropriate number of global bitlines and local bitlines may be in a memory array.

As further shown in FIG. 6, the bitline driver 400 may also include global bitline drivers $412_x$ comprising a paired global wordline NMOS field effect transistors $414_x$ and a global wordline PMOS field effect transistors $416_x$. The operation of the global bitline drivers $412_x$, along the associated global bitline selections $GBL_{SEL<63:0>}$, bitline selection voltage VBL, and global bitline inhibit voltage VPGBL, in generating global bitlines $GBL_x$, as illustrated, is well known in the art and will not be discussed herein.

FIG. 7 illustrates a bitline driver 500 having a single local bitline field effect transistors $502_{x\_y}$ to drive local bitlines $LBL_{x\_y}$, according to one embodiment of the present description. As illustrated, an inhibit voltage $V_{inh\_BL}$ or a selection voltage (either an odd bitline selection signal $BL_{O\_SEL<15:0>}$ or an even wordline selection signal $BL_{E\_SEL<15:0>}$) may pass through a corresponding single field effect transistor $502_{x\_y}$ at different timings. It is understood that although the local bitline field effect transistors $502_{x\_y}$ are illustrated as PMOS field effect transistors, the local bitline field effect transistors $502_{x\_y}$ may also be NMOS field effect transistors. It is further understood that the any appropriate number of global bitlines and local bitlines may be utilized in a given memory array.

The local bitlines $LBL_{x\_y}$ may be designated as either "odd" or "even" in an alternating fashion based on whether they are coupled to a local bitline field effect transistors $502_{x\_y}$ that is coupled to an even local bitline selection signal $BL_{E\_SEL<15:0>}$ or to an odd local bitline selection signal $BL_{O\_SEL<15:0>}$, respectively.

As further shown in FIG. 7, the bitline driver 500 may also include even global bitline drivers $512_{x\_e}$ comprising paired even global bitline NMOS field effect transistors $514_{x\_e}$ and a even global bitline PMOS field effect transistors $516_{x\_e}$, and odd global bitline drivers $512_{x\_o}$ comprising paired odd global bitline NMOS field effect transistors $514_{x\_o}$ and odd global bitline PMOS field effect transistors $516_{x\_o}$. The operation of the even and odd global bitline drivers $512_{x\_e}$ and $512_{x\_o}$ (respectively) along their associated even global bitline selection signals $GBL_{E\_SEL<63:0>}$ and odd global bitline selection signals $GBL_{O\_SEL<63:0}$ (respectively), bitline selection voltage VBL, and global bitline inhibit voltage $V_{inh\_BL}$, in generating the even global bitlines $GBL_{x\_e}$ and the odd global bitlines $GBL_{x\_o}$, as illustrated, is well known in the art and will not be discussed herein. It is understood that the specific circuitry and transistor selection illustrated in FIG. 7 is merely exemplary, and that any appropriate circuitry and transistor selection may be used to generate the even global bitlines $GBL_{x\_e}$ and the odd global bitlines $GBL_{x\_o}$.

In the case of even bitline selection, only one of the even field effect transistors (i.e. a local bitline field effect transistor $502_{x\_y}$ coupled to an even local bitline selection signal $BL_{E\_SEL<15:0>}$) is "on" (grounded) connecting to the selected even global bitline $GBL_{x\_e}$. Further, all of the odd bitline drivers (i.e. a local bitline field effect transistor $502_{x\_y}$ coupled to an odd local bitline selection signal $BL_{O\_SEL<15:0>}$) are "on" connecting to the odd global bitlines driven by an inhibit voltage (i.e., the global bitline inhibit voltage $V_{inh\_BL}$). As a result, all the even bitlines other than the selected are floated, and all the odd bitlines are driven to the inhibit voltage.

Figure 8:
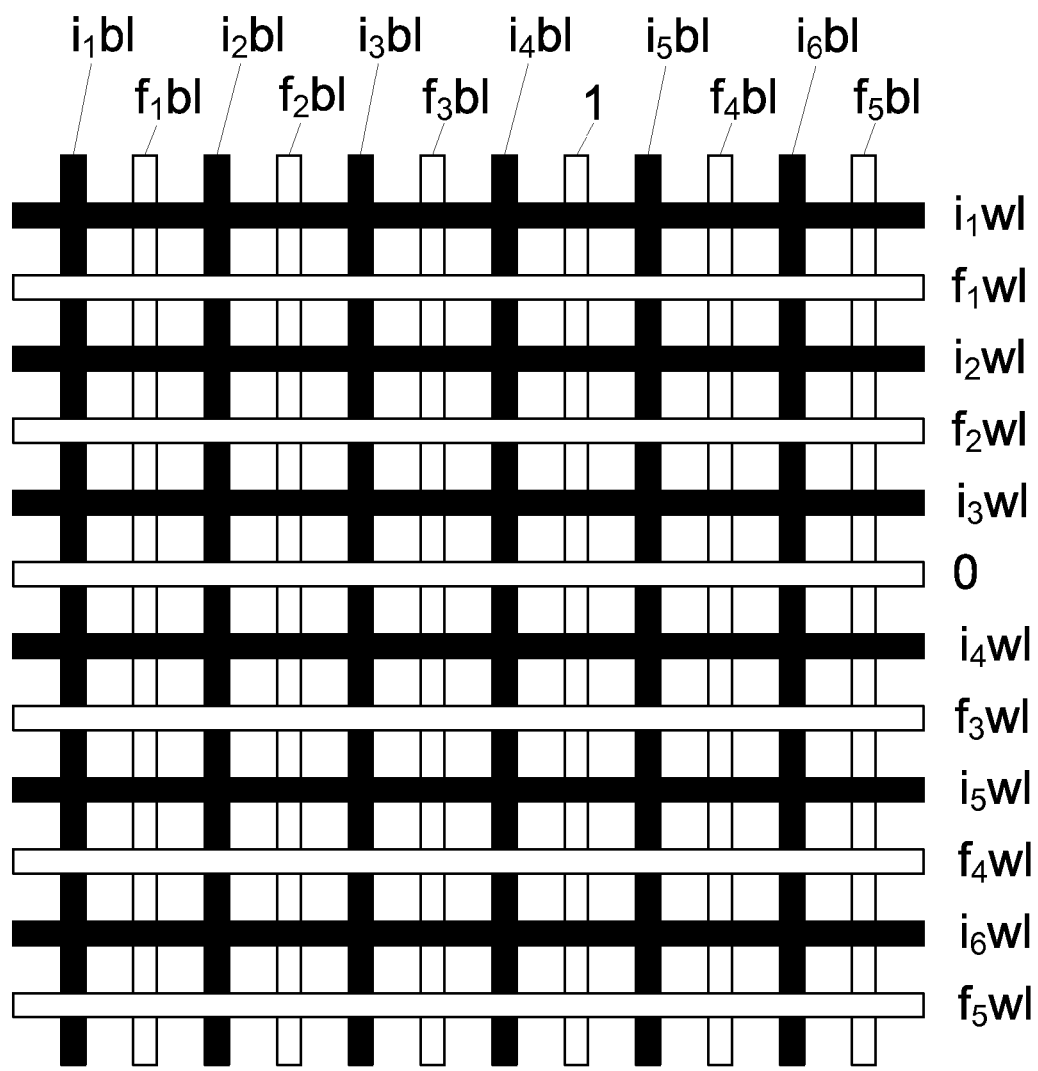
FIG. 8 is a schematic illustrating an inhibit and selection condition for both wordline and bitline side in the case of odd wordline and odd bitline selection in accordance with one embodiment of the present description.

FIG. 8 shows inhibit and selection condition for both wordline and bitline side in the case of odd wordline and odd bitline selection, wherein the odd wordline selected is labeled as "0" and the remainder of the odd wordlines are floating (labeled as $f_1wl$-$f_5wl$), and the even wordlines are driven to an inhibit voltage (labeled as $i_1wl$-$i_6wl$), and wherein the odd bitline selected is labeled as "1" and the remainder of the odd bitlines are floating (labeled as $f_1bl$-$f_5bl$), and the even bitlines are properly driven to an inhibit voltage (labeled as $i_1bl$-$i_6bl$).

Figure 9:
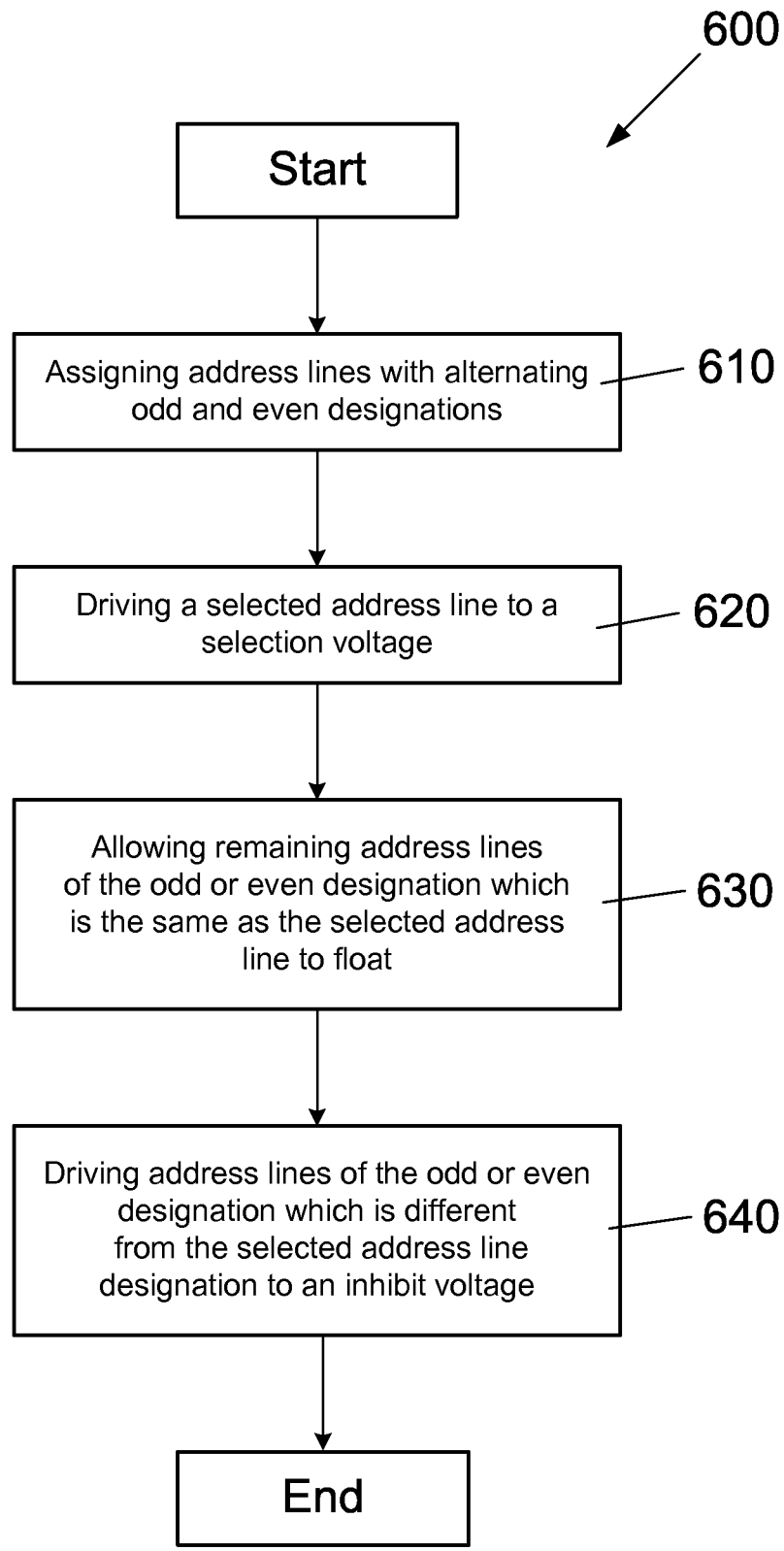
FIG. 9 is a flow diagram of a selecting an address line according to one embodiment of the present description.

FIG. 9 illustrates a flow diagram of process 600 of selecting an address line. As shown in block 610, the address lines may be assigned alternating odd or even designations. One of the address line may be selected, as shown in block 620. The address lines of the odd or even designation which is the same as the selected address line are allowed to float, as shown in block 630. As shown in block 640, the address lines of the odd or even designation which is different from the selected address lines are set to an inhibit voltage.

Figure 10:
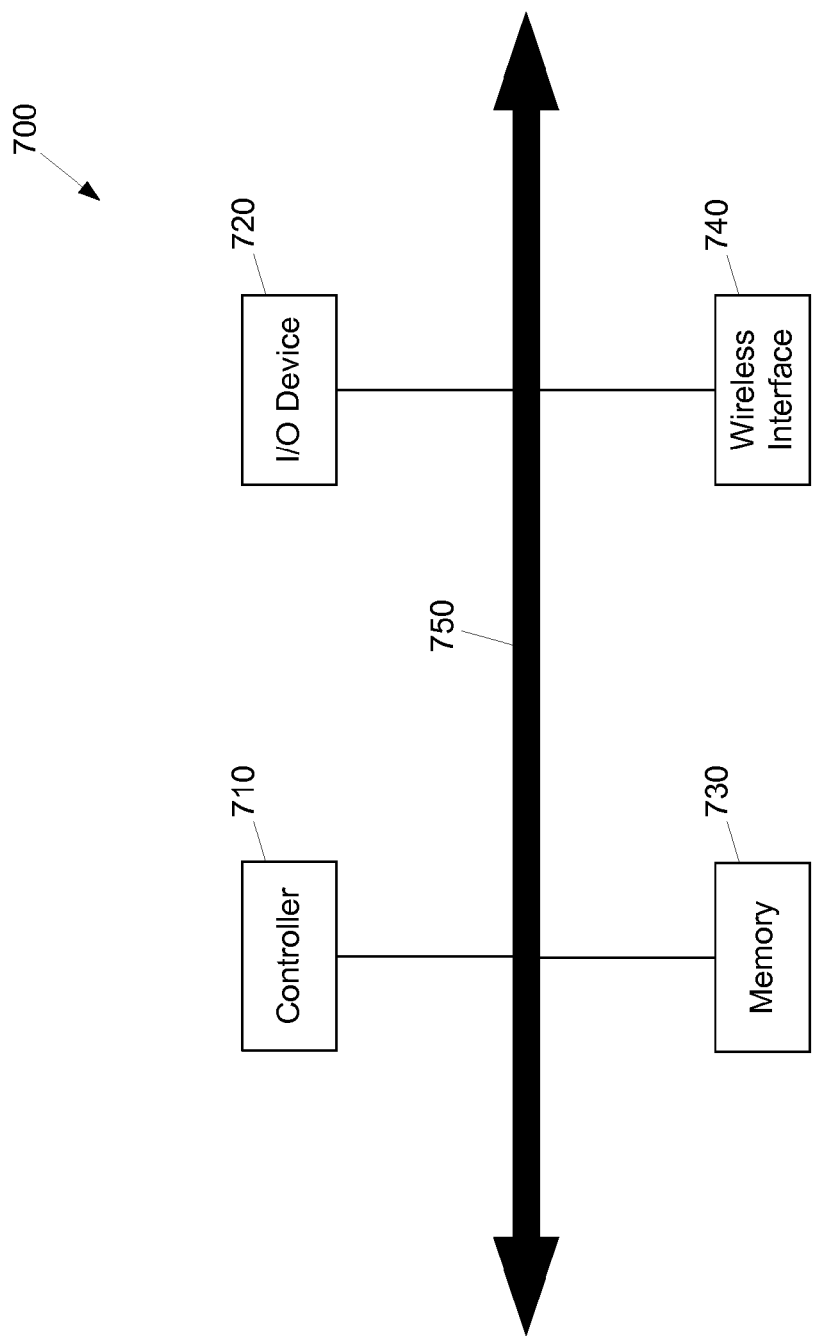
FIG. 10 is a schematic depiction of a system in accordance with one embodiment of the present description.

FIG. 10 illustrates an example of a microelectronic system 700 utilizing the subject matter of the present description. The microelectronic system 700 may be any electronic device, including but not limited to portable devices, such as a portable computer, a mobile telephone, a digital camera, a digital music player, a web tablet, a personal digital assistant, a pager, an instant messaging device, or other devices, The microelectronic system 700 may be adapted to transmit and/or receive information wirelessly, such as through a wireless local area network (WLAN) system, a wireless personal area network (WPAN) system, and/or a cellular network.

The microelectronic system 700 may include a controller 710, an input/output (I/O) device 720 (e.g. a keypad, display, and the like), a memory 730, and a wireless interface 740 coupled to each other via a bus 750. It is understood that the scope of the present invention is not limited to embodiments having any or all of these components.

The controller 710 may comprise, for example, one or more microprocessors, digital signal processors, application specific integrated circuits, microcontrollers, or the like. The memory 730 may be used to store messages transmitted to or by system 700. The memory 730 may also optionally be used to store instructions that are executed by controller 710 during the operation of system 700, and may be used to store user data. The memory 730 may be the provided by one or more different types of memory. For example, the memory 730 may comprise any type of random access memory, a volatile memory, a non-volatile memory such as a flash memory and/or a memory such as PCMS memory discussed herein, wherein the address drivers may comprise single transistors.

The I/O device 720 may be used by a user to generate a message. The system 700 may use the wireless interface 740 to transmit and receive messages to and from a wireless communication network with a radio frequency (RF) signal. Examples of the wireless interface 740 may include an antenna or a wireless transceiver, although the scope of the present invention is not limited in this respect.

By referencing the microelectronic system 700 of FIG. 10, one skilled in the art will understand that the microelectronic system 700 or a computer may include a computer program product stored on a computer readable memory or medium, wherein the computer program may be adapted to be executed within the microelectronic system 700 or on a computer to facilitate assigning address lines with alternating odd or even designations, selecting one address one, allowing address lines of the odd or even designation which is the same as the selected address line are allowed to float, and setting the address lines of the odd or even designation which is different from the selected address lines to an inhibit voltage, in a manner discussed herein.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for programming a non-volatile memory cell, comprising:
   assigning address lines with alternating odd and even designations;
   driving a selected address line to a selection voltage;
   allowing remaining address lines of the odd or even designation which is the same as the selected address line to float; and
   driving address lines of the odd or even designation, which is different from the selected address line designation, to an inhibit voltage.

2. The method of claim 1, wherein:
   assigning address lines with alternating odd and even designations comprises assigning wordlines with alternating odd and even designations;
   driving a selected address line to a selection voltage comprises driving a selected wordline to a selection voltage;
   allowing remaining address lines of the odd or even designation which is the same as the selected address line to float comprises allowing remaining wordlines of the odd or even designation which is the same as the selected wordline to float; and
   driving address lines of the odd or even designation which is different from the selected address line designation to an inhibit voltage comprises driving wordlines of the odd or even designation, which is different from the selected wordline designation, to an inhibit voltage.

3. The method of claim 1, wherein:
   assigning address lines with alternating odd and even designations comprises assigning bitlines with alternating odd and even designations;
   driving a selected address line to a selection voltage comprises driving a selected bitline to a selection voltage;
   allowing remaining address lines of the odd or even designation which is the same as the selected address line to float comprises allowing remaining bitlines of the odd or even designation which is the same as the selected bitline to float; and
   driving address lines of the odd or even designation which is different from the selected address line designation to an inhibit voltage comprises driving bitlines of the odd or even designation, which is different from the selected bitline designation, to an inhibit voltage.

4. The method of claim 1, wherein assigning address lines comprises assigning bitlines and wordlines with alternating odd and even designations, wherein driving a selected address line to a selection voltage comprises driving a selected bitline to a bitline selection voltage and a wordline to a wordline selection voltage, wherein allowing remaining address lines of the odd or even designation which is the same as the selected address line to float comprises allowing remaining bitlines of the odd or even designation which is the same as the selected bitline to float and allowing remaining wordlines of the odd or even designation which is the same as the selected wordline to float; and driving address lines of the odd or even designation which is different from the selected address line designation to an inhibit voltage comprises driving bitlines of the odd or even designation which is different from the selected bitline designation to a bitline inhibit voltage and driving wordlines of the odd or even designation which is different from the selected wordline designation to a wordline inhibit voltage.

* * * * *